(12) United States Patent
Harada et al.

(10) Patent No.: US 6,771,483 B2
(45) Date of Patent: Aug. 3, 2004

(54) ELECTROSTATIC CHUCK MEMBER AND METHOD OF PRODUCING THE SAME

(75) Inventors: Yoshio Harada, Hyogo (JP); Junichi Takeuchi, Hyogo (JP); Kenichiro Togoe, Hyogo (JP)

(73) Assignee: Tocalo Co., Ltd., Hyogo (JP)

( * ) Notice: Subject to any disclaimer, the term of this patent is extended or adjusted under 35 U.S.C. 154(b) by 173 days.

(21) Appl. No.: 10/169,755

(22) PCT Filed: Jan. 17, 2001

(86) PCT No.: PCT/JP01/00270
§ 371 (c)(1),
(2), (4) Date: Jul. 19, 2002

(87) PCT Pub. No.: WO01/54188
PCT Pub. Date: Jul. 26, 2001

(65) Prior Publication Data
US 2003/0007308 A1 Jan. 9, 2003

(30) Foreign Application Priority Data
Jan. 21, 2000 (JP) ........................................ 2000-012818

(51) Int. Cl.$^7$ ........................... H02N 13/00; H01L 21/68
(52) U.S. Cl. ...................................................... 361/234
(58) Field of Search ............................... 361/233, 234; 279/128; 427/446, 447, 452, 453

(56) References Cited

U.S. PATENT DOCUMENTS

| 5,909,354 A | * | 6/1999 | Harada et al. ............... 361/234 |
| 5,922,275 A | | 7/1999 | Kageyama et al. ......... 420/428 |

FOREIGN PATENT DOCUMENTS

| JP | 01253375 | 10/1989 | ............ H04N/5/58 |
| JP | 03147843 | 6/1991 | ........... B32B/18/00 |
| JP | 03204924 | 9/1991 | ......... H01L/21/302 |
| JP | 05235152 | 9/1993 | ............ H01L/21/68 |
| JP | 06008089 | 1/1994 | ............ B23Q/3/15 |
| JP | 06302677 | 10/1994 | ............ H01L/21/68 |
| JP | 07297265 | 11/1995 | ............ H01L/21/68 |
| JP | 08064663 | 3/1996 | ............ H01L/21/68 |
| JP | 08330403 | 12/1996 | ............ H01L/21/68 |
| JP | 09069554 | 3/1997 | ............ H01L/21/68 |
| JP | 10261697 | 9/1998 | ............ H01L/21/68 |
| JP | 11008291 | 1/1999 | ............ H02N/13/00 |
| JP | 11026564 | 1/1999 | ............ H01L/21/68 |
| JP | 11069855 | 3/1999 | ............ H02N/13/00 |
| JP | 11111826 | 4/1999 | ............ H01L/21/68 |
| JP | 11312729 | 11/1999 | ............ H01L/21/68 |

OTHER PUBLICATIONS

English Language Abstract for JP Appln. No. 01–253375.
English Language Abstract for JP Appln. No. 03–147843.
English Language Abstract for JP Appln. No. 03–204924.
English Language Abstract for JP Appln. No. 05–235152.
English Language Abstract for JP Appln. No. 06–008089.
English Language Abstract for JP Appln. No. 06–302677.
English Language Abstract for JP Appln. No. 07–297265.
English Language Abstract for JP Appln. No. 08–064663.
English Language Abstract for JP Appln. No. 08–330403.
English Language Abstract for JP Appln. No. 09–069554.
English Language Abstract for JP Appln. No. 10–261697.
English Language Abstract for JP Appln. No. 11–008291.
English Language Abstract for JP Appln. No. 11–026564.
English Language Abstract for JP Appln. No. 11–069855.
English Language Abstract for JP Appln. No. 11–111826.
English Language Abstract for JP Appln. No. 11–312729.

* cited by examiner

Primary Examiner—Ronald Leja
(74) Attorney, Agent, or Firm—Greenblum & Bernstein, P.L.C.

(57) ABSTRACT

It is to provide an electrostatic chuck member having a strong adsorption force and an excellent responsibility (release property) in the stop of voltage application and is an electrostatic chuck member comprising a substrate, an undercoat of a metallic layer formed on at least one surface thereof, a lower insulating layer of $Al_2O_3$ ceramic formed on the undercoat, a metallic electrode layer formed on the lower insulating layer and an upper insulating layer of $Al_2O_3$ ceramic formed on the electrode layer as a topcoat.

10 Claims, 1 Drawing Sheet

ELECTROSTATIC CHUCK MEMBER AND METHOD OF PRODUCING THE SAME

TECHNICAL FIELD

This invention relates to an electrostatic chuck member used when a conductive member, a semiconductive member, an insulative member or the like is held at adsorption state by static electricity, and a method of producing the same.

BACKGROUND ART

Recently, treatments such as dry etching, ion implantation, CVD, PVD and the like constituting a part of a production process for semiconductor or liquid crystal display, e.g. a production device of semiconductors changes from a wet process into a dry process from viewpoints of automation and anti-pollution. A greater part of the treatment through the dry process is usually carried out under vacuum or in an atmosphere under a reduced pressure.

In such a dry process treatment, it is required to improve a positioning accuracy in the formation of patterns on a substrate such as a silicon wafer, a glass plate or the like from viewpoints of high integration of circuits and fine work.

As a method satisfying such a demand, vacuum chuck or mechanical chuck has hitherto been utilized in the transportation, adsorption and fixation of the substrate. However, since the vacuum chuck is used under vacuum, the pressure difference is not made large and the adsorption force is weak. Even if the substrate can be adsorbed, an adsorbing portion becomes local and strain is caused in the substrate. Furthermore, the gas cooling can not be carried out with the temperature rising in the treatment of the wafer, so that the vacuum chuck can not be applied to the recent production process of high-performance semiconductor devices. On the other hand, the mechanical chuck becomes complicated in the structure and takes a long time in the maintenance and inspection thereof.

In order to avoid the above drawbacks of the conventional technique, electrostatic chuck utilizing static electricity is recently developed and widely adopted. However, this technique has the following problems.

When the substrate is adsorbed and held by such an electrostatic chuck, charge retains between the substrate and the electrostatic chuck (through the action of adsorption force) even after the applied voltage is topped, so that the detaching of the substrate can not be carried out unless the charge is completely removed.

For this end, it has been attempted to improve the insulating dielectric material used in the electrostatic chuck. For example, there are the following proposals:

① JP-A-6-8089 discloses an example of using a sintered body or a spray coating of a mixture of aluminum nitride powder and titanium nitride powder as a high insulative material;
② JP-A-6-302677 discloses that titanium oxide is applied onto a surface of the high insulative material and aluminum is applied thereto to contact with Si+SiC plate;
③ JP-B-6-36583 discloses an example using aluminum oxide as a high insulative material;
④ JP-A-5-235152 and JP-A-6-8089 disclose that aluminum oxide, aluminum nitride, zinc oxide, quartz, boron nitride, sialon and the like are used as a high insulative material;
⑤ JP-A-3-147843 and JP-A-3-204924 disclose a method wherein volume resistivity is lowered to improve static electricity by adding $TiO_2$ having a high dielectric constant to the high insulative material in case of further requiring a higher static electricity;
⑥ The high insulative material of $Al_2O_3$ or the like containing $TiO_2$ has a drawback that adsorption force remains for an interim even after the power source is switched off. As a technique overcoming this drawback, therefore, JP-A-11-111826, JP-A-11-69855 and the like disclose a method wherein a polarity of an electrode is reversed for shortening a detaching time of a silicon wafer;
⑦ JP-A-8-64663 discloses a method wherein a coating having a conductivity is formed on a part of an insulating layer for rapidly conducting the detaching of the silicon wafer;
⑧ JP-A-8-330403, JP-A-11-26564 and the like disclose an electrostatic chuck member having a water-cooling structure for preventing temperature rise of the electrostatic chuck in the operation and the lowering of performances accompanied therewith.

However, a $Al_2O_3$—$TiO_2$ based high insulative spray-coated layer used in the electrostatic chuck has the following problems to be solved.

(1) In the $Al_2O_3$ based spray-coated layer mixed with $TiO_2$, the volume resistivity is small and a slight current flows, so that it can be expected to improve the static electricity through Jensen-Rahbek effect (A. Jensen & K. Rahbek s force). However, since $TiO_2$ is a semiconductor substance, the moving rate of electrical charge is slow and the responsibility (arrival time of saturated adsorption, adsorption disappearing time) when the application of voltage is stopped is poor, and this responsibility becomes more remarkable under low-temperature environment.

In order to render the value of volume resistivity into, for example, a practical state of $1\times10^9$ $\Omega \cdot cm$, it is necessary to add about 25 wt % of $TiO_2$. In the production process of semiconductors, however, the addition of a great amount of $TiO_2$ means the incorporation of impurity, which brings about the degradation of quality and results in the contamination of working environment.

Furthermore, when the temperature of the semiconductor wafer to be adsorbed is higher than room temperature, there is a high possibility that a large leak current is passed to break wafer circuit because the volume resistivity is too low.

(2) The $Al_2O_3.TiO_2$ based spray-coated layer is formed by a spraying process. In the coating obtained by this method, however, the volume resistivity and adsorption force are largely scattered and also the productivity is low to bring about the rise of the cost.

It is, therefore, a main object of the invention to provide an electrostatic chuck member having a large volume resistivity, a small scattering thereof and a good quality.

It is another object of the invention to provide an electrostatic chuck member having a strong adsorption force and an excellent responsibility (release property) in the stop of voltage application.

It is the other object of the invention to provide a spray-coated layer for an electrostatic chuck member without $TiO_2$ damaged by contact with a silicon wafer, a physical erosion action through plasma or a chemical erosion action through a halogen compound included in an environment and fearing a pollution of environment.

It is a still further object of the invention to propose a substitute technique for overcoming such a drawback that the conventional $Al_2O_3$ insulative substrate produced by the sintering process is easily damaged by a temperature change in a use environment.

It is a yet further object of the invention to form a greater part of not only an insulating layer but also an electrode by a spraying method to develop a high productivity, a good coating adhesion property and an excellent static electricity for overcoming drawbacks inherent to the conventional electrostatic chuck member formed by spraying a ceramic around a metal electrode.

DISCLOSURE OF THE INVENTION

An electrostatic chuck member according to the invention is formed by laminating a metallic electrode layer and an insulating layer of an oxide ceramic having an electric resistance onto a surface of a metal substrate through spraying.

That is, a basic construction of the invention is an electrostatic chuck member comprising a substrate, a metallic undercoat formed on at least one surface thereof, a lower insulating layer of $Al_2O_3$ ceramic formed on the undercoat, a metallic electrode layer formed on the lower insulating layer and an upper insulating layer of $Al_2O_3$ ceramic formed on the electrode layer as a topcoat.

In the invention, the metallic undercoat is a spray-coated layer having a thickness of 30–300 μm, and each of the lower insulating layer and the upper insulating layer is a spray-coated layer having a thickness of 100–500 μm, and the metallic electrode layer is a spray-coated layer having a thickness of 5–100 μm and is favorable to have an oxygen amount included in the metallic electrode layer of not more than 2.0 wt % and a porosity of 1–7%.

Each of the lower and upper insulating layers made of $Al_2O_3$ ceramic is preferable to be formed by spraying a spraying material powder having a purity of not less than 98.0 wt % so as to render the porosity into a range of 1–8%.

It is favorable that at least one surface of each of the lower insulating layer and the upper insulating layer is sealed by impregnating an organic or inorganic silicon compound and a volume resistivity of such a layer is within a range of $1 \times 10^{13} - 1 \times 10^{15}$ Ω·cm.

The metallic electrode layer is favorable to be formed using at least one spraying material selected from W, Al, Cu, Nb, Ta, Mo, Ni and alloys containing at least one of these metallic elements.

The metallic undercoat applied between the substrate and the lower insulating layer of $Al_2O_3$ ceramic for improving a bonding force therebetween is favorable to be formed by using at least one spraying material selected from Ni, Al, Cr, Co, Mo and an alloy containing at least one of these metallic elements.

The upper insulating layer of $Al_2O_3$ occupied as a topcoat in an outermost surface layer portion of the electrostatic chuck member according to the invention is preferable to be finished a contact face with a silicon wafer supported thereon to a surface roughness Ra: about 0.1–2.0 μm by mechanical working.

As a spraying process used in the production of the electrostatic chuck member according to the invention, any one of low-speed and high-speed flame spraying process, arch spraying process, atmosphere plasma spraying process, plasma spraying process under a reduced pressure, explosion spraying process and the like may be used in the formation of the metallic undercoat. On the other hand, it is favorable to adopt atmosphere plasma spraying process, plasma spraying process under a reduced pressure or the like in the formation of the $Al_2O_3$ ceramic insulating coated-film.

Although the example of film formation is described by limiting only the spraying process in the invention, it is possible to conduct similar film-forming means such as CVD, PVD, ion implantation and the like, if necessary.

BEST MODE FOR CARRYING OUT THE INVENTION

Figure 1:
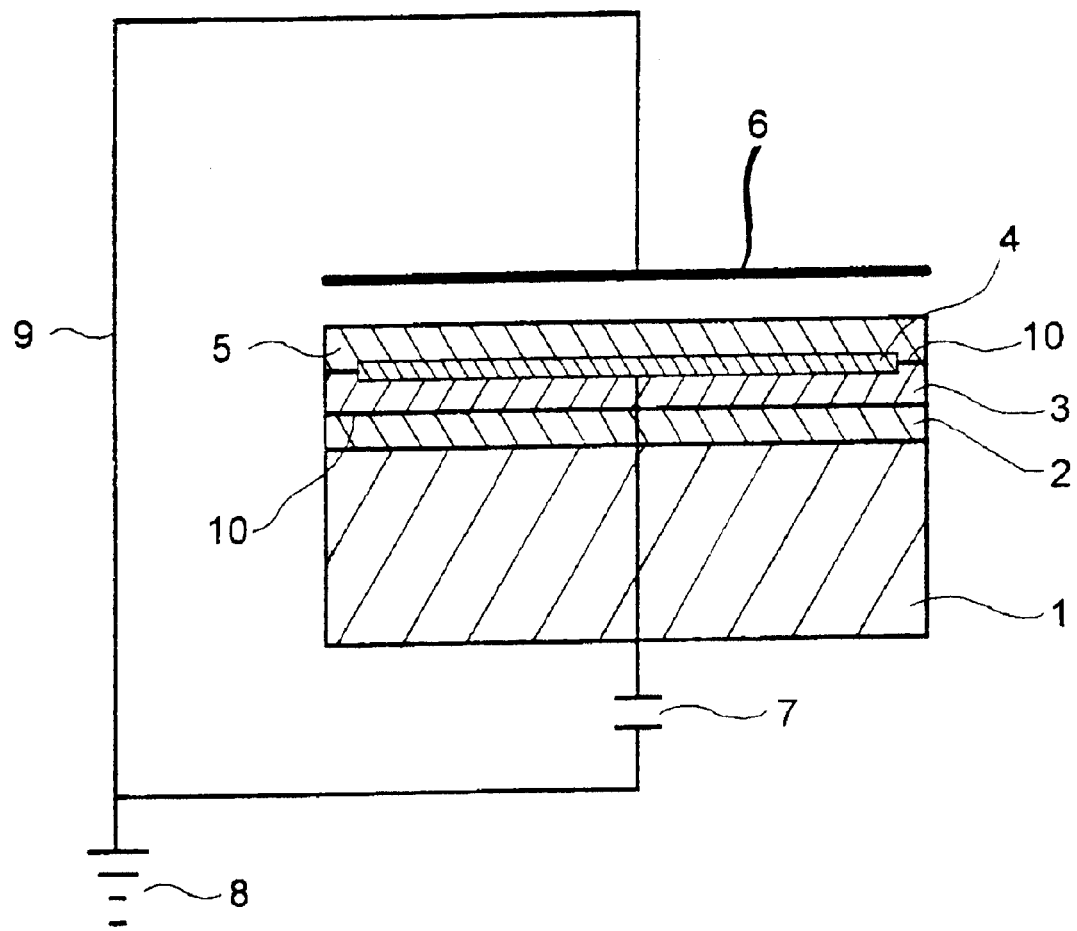
FIG. 1 is a diagrammatic view illustrating a sectional structure of an electrostatic chuck according to the invention.

An example of producing an electrostatic chuck according to the invention through a spraying process will be described below.

At first, a surface of a metal substrate is subjected to a blast treatment and subsequently to a roughening treatment, and then a metallic spraying material is sprayed onto a surface of the thus treated substrate to form an undercoat. On the undercoat is formed a lower sprayed insulating layer of $Al_2O_3$ ceramic by a spraying process. And also, a metallic sprayed electrode layer is formed on a surface of the lower sprayed insulating layer, preferably so as to leave a peripheral edge portion by a spraying process, which is ready in use as an electrode. Further, an upper sprayed insulating layer is formed on the metallic sprayed electrode layer by spraying $Al_2O_3$ ceramic. In this way, an electrostatic chuck member having a lamination structure as shown in FIG. 1 is produced.

When the metallic sprayed electrode layer is sandwiched between the sprayed insulating layers of $Al_2O_3$ ceramic from up and down, initial performances can be maintained over a long time without being affected by corrosive gas in the environment or plasma even under any use environment.

It is preferable that a diameter of the metallic sprayed electrode layer is used to be at least 5 mm smaller than a diameter of each of the upper and lower insulating layers of $Al_2O_3$ ceramic in order than the end face of the electrode is not exposed to an exterior.

In FIG. 1, numeral 1 is a metal substrate, numeral 2 an undercoat made of a metallic sprayed layer, numeral 3 a lower sprayed insulating layer of $Al_2O_3$ ceramic, numeral 4 a metallic sprayed electrode layer, numeral 5 an upper sprayed insulating layer of $Al_2O_3$ ceramic as a topcoat, numeral 6 a silicon wafer, numeral 7 a direct current source, numeral 8 a ground, and numeral 9 a copper wire for application of voltage. Each film (layer) from the undercoat 2 to the topcoat 5 is formed by the spraying process. Moreover, numeral 10 is a place directly contacting $Al_2O_3$ ceramic sprayed insulating layers of the upper sprayed insulating layer 3 and the lower sprayed insulating layer 5 with each other.

As a spraying material for forming the metallic undercoat 2, one or more of metals such as Ni, Al, Cr, Co, Mo and the like and alloys thereof are suitable, and a thickness thereof is preferably 30–300 μm, particularly 50–150 μm. When the thickness is less than 30 μm, the film becomes non-uniform, while when it exceeds 300 μm, the improvement of the function as the undercoat is not particularly recognized and such a thickness is unfavorable in view of economical reason and operation.

The upper sprayed insulating layer and the lower sprayed insulating layer of $Al_2O_3$ ceramic formed on the undercoat 2 and positioned up and down on the metallic sprayed electrode layer 4 so as to sandwich therebetween are required to have excellent electric insulating property, corrosion resistance and resistance to plasma erosion. For this purpose, these layers are required to be high in the purity and dense. According to the inventors experiments, it has been confirmed that the purity is preferable to be not less than 98%, particularly not less than 99% and the porosity of the sprayed film is preferable to be within a range of 1–8%, particularly 1–5%.

And also, the thickness of each of the upper-lower sprayed insulating layers of the $Al_2O_3$ ceramic is preferably within a range of 100–500 μm. When it is less than 100 μm, the electric insulating property is not sufficient, while when it exceeds 500 μm, the remarkable effect is not obtained and it is not economical. Preferably, it is 130–400 μm.

The metallic sprayed electrode layer formed on the surface of the lower sprayed insulating layer is desirable to be formed by spraying one ore more selected from W, Al, Cu, Nb, Ta, Mo, Ni and alloy containing one or more of these metals. And also, the thickness is preferable within a range of 5–100 μm. When the thickness is less than 5 μm, the layer becomes porous and the action and function as the electrode lower, while when it exceeds 100 μm, the considerable improvement of the characteristics as the electrode is not recognized and it is uneconomical. Particularly, a range of 10–30 μm is preferable.

The porosity of the sprayed electrode layer is favorable to be smaller. It has been confirmed that there is not particularly caused a problem when the porosity in the film formed by the spraying process is within a range of 1–8%. Moreover, when the porosity is not more than 1%, it is difficult to form the film in an atmosphere by spraying. While, when the porosity exceeds 7%, the temperature of the electrode layer is unfavorably raised by heat generation through the penetration of corrosive gas included in the atmosphere or increase of electric resistance in the application of voltage.

In case of the sprayed electrode layer, an oxide film produced when the metal is sprayed in the atmosphere is an electrically resistant source and is not favorable. According to the experimental result, it is has been confirmed that an amount of not more than 2.0 wt % included is not particularly trouble as a sprayed electrode layer. In the invention is formed the sprayed electrode layer having an oxygen content of not more than 2.0 wt %.

Then, it is preferable that the upper sprayed insulating layer of $Al_2O_3$ ceramic formed on an outermost layer as a topcoat is polished so as to be parallel to the surface of the metal substrate and finished to a surface roughness Ra of 0.1–2.0 μm by machining (polishing).

Particularly, the finished surface of the mechanically polished upper sprayed insulating layer is subjected to a sealing treatment by applying a liquid organosilicon compound (organic silicon resin, for example, methyl silyl triisocyanate, phenyl silyl triisocyanate) or an inorganic silicon compound (for example, silicon alkoxide compound, silicon compound of alkali metal) and heating at 120–350° C. for 1–5 hours. By this sealing treatment is filled the silicon compound in fine pore portions remaining in the sprayed layer, whereby the adhesion of foreign matter can be prevented and the invasion of corrosive gas from operating environment can be prevented. Moreover, the sealing treatment may be applied to the lower sprayed insulating layer of $Al_2O_3$ ceramic.

As mentioned above, the formation of the metallic sprayed layer as the undercoat, the metallic sprayed electrode layer, and the upper and lower sprayed insulating layers of $Al_2O_3$ ceramic can be conducted by using a plasma spraying process, a high-speed flame spraying process, an explosion spraying process, an arc spraying process (only the metallic) and the like, but the use of an atmospheric plasma spraying process or a plasma spraying process under a reduced pressure is particularly favorable in view of the productivity and the stability of quality.

EXAMPLE 1

After a one-side surface of an Al substrate (width 50 mm×length 100 mm×thickness 5 mm) is roughened by blast treatment, 80 wt % Ni-20 wt % Al alloy is formed on the roughened surface at a thickness of 80 μm as an undercoat by a flame spraying process. On the undercoat is formed $Al_2O_3$ ceramic at a thickness of 150 μm by an atmosphere plasma spraying process, and subsequently a metallic tungsten (W) is formed as a sprayed electrode layer on the $Al_2O_3$ ceramic sprayed layer at a thickness of 60 μm by an atmosphere plasma spraying process. Moreover, an oxygen content in the electrode layer is 0.11 wt %. Then, an upper sprayed insulating layer of $Al_2O_3$ ceramic as a topcoat is formed on the surface of the metallic tungsten electrode layer by an atmosphere plasma spraying process to form a test piece.

The thus prepared test piece is continuously left to stand under the following corrosive environment for 200 hours to examine a state of generating corrosion in the metallic tungsten electrode layer through corrosive component invaded from pore portions of the upper sprayed insulating layer of $Al_2O_3$ ceramic as the topcoat.

(1) Test for spraying salt water (JIS Z2371)
(2) Test for resistance to halogen corrosion (the test piece is placed in an atmosphere of a plastic corrosion testing apparatus introduced with 120 ml/min of a mixed gas of CHF3 40 ml+Ar 60 ml, testing temperature 60° C.)

The results of the above corrosion test are shown in Table 1. As seen from the results of Table 1, when the thickness of the upper sprayed insulating layer of $Al_2O_3$ ceramic is not less than 80 μm, the corrosive component invading into the inside is shut even in the test of spraying salt water and the test for the resistance to halogen corrosion and there is observed no sign of corrosion in the tungsten electrode layer and the appearance just after the spraying is maintained. On the contrary, when the thickness of the $Al_2O_3$ ceramic insulating layer is 50 μm, 30 μm, the corrosive component invades through the pore portion to considerably corrode the tungsten electrode layer and the function as an electrode tends to disappear.

TABLE 1

| | Construction of film | | Corrosion test results (after 300 h) | | |
|---|---|---|---|---|---|
| No. | Thickness of electrode layer | Thickness of upper insulating layer | Corrosion test | Test for resistance to halogen corrosion | Remarks |
| 1 | 150 | 30 | large color change by corrosion | large color change by corrosion | Comparative Example |
| 2 | 150 | 50 | large color change by corrosion | large color change by corrosion | |
| 3 | 150 | 80 | No problem | No problem | Invention |
| 4 | 150 | 150 | No problem | No problem | Example |

TABLE 1-continued

| | Construction of film | | Corrosion test results (after 300 h) | | |
|---|---|---|---|---|---|
| No. | Thickness of electrode layer | Thickness of upper insulating layer | Corrosion test | Test for resistance to halogen corrosion | Remarks |
| 5 | 150 | 300 | No problem | No problem | |
| 6 | 150 | 500 | No problem | No problem | |

(Remarks)
(1) Unit of layer thickness is μm
(2) The test piece after the corrosion test is obtained by mechanically removing only the upper insulating layer to expose the electrode layer, from which are evaluated a change of appearance and a state of color change in the upper insulating layer contacted therewith.

EXAMPLE 2

In this example, thermal shock resistance is tested with respect to the electrostatic chuck member according to the invention and a sprayed layer around a metal electrode proposed in the prior art (e.g. JP-A-6-36583) as a comparative example.

(1) Layer Structure Adopted in the Electrostatic Chuck Member According to the Invention The following layers are formed on a one-side surface of Al substrate having a diameter of 100 mm and a thickness of 10 mm by using atmosphere plasma spraying process and plasma spraying process under a reduced pressure.

① Undercoat: 80 wt % Ni-20 wt % Al at 100 μm by atmosphere plasma spraying process
② Lower sprayed insulating layer: 99.5 wt % $Al_2O_3$ at 150 μm by atmosphere plasma spraying process
③ Metallic electrode layer: a. metal W at 30 μm by atmosphere plasma spraying process b. metal W at 30 μm by plasma spraying process under a reduced pressure
④ Upper sprayed insulating layer: 99.5 wt % $Al_2O_3$ at 150 μm by atmosphere plasma spraying process (2) Layer Structure of Comparative Example ① Undercoat: a. 80 wt % Ni-20 wt % Al at 100 μm by atmosphere plasma spraying process b. no undercoat
② Insulating layer: 99.5 wt % $Al_2O_3$ at 150 μm by atmosphere plasma spraying process Moreover, the layer is coated onto a whole circumference of Al substrate having a diameter of 100 mm and a thickness of 10 mm in the comparative example.

(3) Thermal Shock Test Conditions

When an operation that the member is heated in air at 350° C. for 15 minutes and thereafter a compressed air of 25° C. is blown thereonto for 10 minutes is one cycle, the test of 10 cycles is conducted.

(4) Test Results

The results of the above test are shown in Table 2. As seen from these results, the layer of the comparative example sprayed on the whole circumference of the Al substrate generates cracks in the test of 1–3 cycles irrespectively of the presence or absence of the undercoat. This is considered due to the fact that there is a large difference in thermal expansion coefficient between the Al substrate and the $Al_2O_3$ sprayed layer and the layer is formed on the whole circumference of the substrate to apply a large stress to the layer.

On the contrary, the layer satisfying the structure requirment according to the invention maintains a sound state even after the test of 10 cycles and develops a high thermal shock resistance.

TABLE 2

| | | Construction of film | | | Thermal shock conditions | |
|---|---|---|---|---|---|---|
| No | Undercoat | Lower insulating layer | Metallic electrode layer | Upper insulating layer | 350° C. × 15 min ⇔ cooling in air | Remarks |
| 1 | presence | presence | presence*(1) | presence | No problem after 10 cycles | Comparative Example |
| 2 | presence | presence | presence*(2) | presence | No problem after 10 cycles | |
| 3 | presence | absence | absence | presence | No problem after 3 cycles | Invention Example |
| 4 | absence | absence | absence | presence | No problem after 1 cycle | |

(Remarks)
(1) The undercoat is 80 wt % Ni-20 wt % Al of 100 μm
(2) Metallic electrode layer
*(1) is metal W of 30 μm by atmosphere plasma spraying process (oxygen content 0.12 wt %)
*(2) is 30 μm by plasma spraying process under a reduced pressure (oxygen content 0.12 wt %)
(3) Upper and lower insulating layers are formed at 150 μm by using $Al_2O_3$ through atmosphere plasma spraying process.

EXAMPLE 3

In this example, a change of residual adsorption force with a lapse of time is examined when an operation is carried out by adsorbing a silicon wafer on the electrostatic chuck member and then a power source is switched off.

(1) Layer Structure of Electrode Chuck Member Produced Under Conditions Suitable for the Invention The following sprayed layers are formed on an Al substrate having a diameter of 6 inches.

① Undercoat: 80 wt % Ni-20 wt % Al 80 μm
② Lower sprayed insulating layer: $Al_2O_3$ 150 μm
③ Metallic electrode layer: W 50 μm
④ Upper sprayed insulating layer: $Al_2O_3$ 150 μm
(2) Layer Structure of Electrode Chuck in Comparative Example The following sprayed layers are formed on an Al substrate having a diameter of 6 inches.
① Undercoat: 80 wt % Ni-20 wt % Al 80 μm
② Topcoat: 88 wt % $Al_2O_3$-12 wt % $TiO_2$ 300 μm The measurement of residual adsorption force is carried out by applying a voltage of 1 kV between a silicon wafer and an electrostatic chuck member in a vacuum vessel of 0.01 hpa for 1 minute and switching off a power source to measure the force (Pa) of peeling off the silicon wafer from the electrostatic chuck member.

As a result, in the electrostatic chuck member according to the invention, the adsorption force is disappears just after OFF of the power, while the electrostatic chuck member of $Al_2O_3$—$TiO_2$ in the comparative example (prior art) is required to take 30–45 seconds for completely disappearing the adsorption force.

EXAMPLE 4

In this example, as the layers of the electrostatic chick member according to the invention, after an Al substrate (width 50 mm×length 50 mm×thickness 5 mm) is roughened by a blast treatment, 80 wt % Ni-20 wt % Al is formed at 70 μm by an arc spraying process, and $Al_2O_3$ is formed thereon at 180 μm by a plasma spraying process, and a metal W is formed thereon at 50 μm by a plasma spraying process, and $Al_2O_3$ is formed thereon at 200 μm by a plasma spraying process. Immediately after the formation of the layers, a commercially available liquid organic silicon resin is applied as a sealing agent and dried to obtain a test piece.

After the test piece is masked so as to expose a constant surface (10×10 mm), plasma is continuously discharged in a gas including a halogen compound for 40 hours, and a loss quantity of the exposed portion due to plasma erosion is evaluated by a maximum loss thickness.

Test Conditions:
Gas composition $CF_4$ 100 ml+$O_2$ 10 ml+Ar 1000 ml
High frequency output 1200W
Pressure atmospheric pressure Moreover, the test is carried out by using Al substrate subjected to aluminizing treatment as a comparative example and the same layer structure as in the invention except for an upper sprayed insulating layer of $Al_2O_3$+12 wt % $TiO_2$ of 200 μm under the same conditions.

As seen from the test results, the sprayed insulating layer according to the invention has an erosion quantity of about 12–15 μm, while the aluminized film of the comparative example is completely disappeared and the Al substrate is damaged (50–70 μm), and the $Al_2O_3$+$TiO_2$ layer is observed to have a damage of 31–38 μm, from which it is understood that the electrostatic chuck member according to the invention is very stable even in the plasma environment including the halogen compound.

INDUSTRIAL APPLICABILITY

As mentioned above, the electrostatic chuck member according to the invention is excellent in the corrosion resistance, thermal shock resistance and erosion resistance and can fix the silicon wafer only by a Coulomb force because the metallic sprayed electrode layer is sandwiched between upper and lower $Al_2O_3$ ceramic sprayed insulating layers, so that the holding force immediately disappears in the switch-off of the power source and the detaching of the silicon wafer or the like is facilitated, which contributes to the improvement of the operation efficiency.

And also, since the topcoat insulating layer is made of the sprayed film of $Al_2O_3$ ceramic, the electrostatic chuck member according to the invention has an excellent resistant force to abrasion action due to the contact with the silicon wafer or plasma erosion action and prevents the fine pulverization of the sprayed layer components and is high in the chemical stability, so that it has an effect of controlling the corrosion reaction with the environmental component (halogen compound and the like) to prevent the pollution of the environment. Furthermore, in the electrostatic chuck member according to the invention, the metallic sprayed electrode layer is not directly exposed to the environment, so that it is less in the corrosion and modification and maintains an excellent function over a long time and it can be expected to efficiently conduct a precise working operation of an electronic material member such as silicon wafer or the like in a higher quality. Moreover, the whole circumference of the metal electrode is not required to be covered with the insulating ceramic as compared with the conventional technique, so that the whole of the electrostatic chuck can be miniaturized and the production steps can be considerably shortened.

In addition, the invention is particularly useful as a member to be incorporated into a dry etching device, an ion implantation device, a CVD device, a PVD device or the like used in the production process of semiconductors and liquid crystals.

What is claimed is:

1. An electrostatic chuck member comprising a substrate, an undercoat of a metallic sprayed layer formed on at least one surface thereof and having a thickness of 30–300 μm, a lower insulating layer of $Al_2O_3$ ceramic sprayed layer formed by spraying $Al_2O_3$ having a purity of not less than 98 wt % on the undercoat and having a thickness of 100–500 μm and a porosity of 1–8%, an electrode layer of a metallic sprayed layer formed by spraying a metal spraying material having a particle size smaller than a particle size of an insulation spraying material on the lower insulating layer and having an oxygen content of not more than 2.0 wt %, a thickness of 5–100 μm and a porosity of 1–7%, and an upper insulating layer of $Al_2O_3$ ceramic sprayed layer formed by spraying $Al_2O_3$ having a purity of not less than 98 wt % on the electrode layer and having a thickness of 100–500 μm and a porosity of 1–8% and finishing a surface of the upper insulating layer to a surface roughness Ra of about 0.1–2.0 μm as a topcoat.

2. An electrostatic chuck member according to claim 1, wherein the undercoat is a metallic layer formed by spraying one or more of Ni, Al, Cr, Co, Mo and an alloy containing one or more of these metal elements.

3. An electrostatic chuck member according to claim 1, wherein at least one surface of each of the lower insulating layer and the upper insulating layer is sealed with an organic or inorganic silicon compound and has a volume resistivity within a range of $1×10^{13}$–$1×10^{15}$ Ω·cm.

4. An electrostatic chuck member according to claim 1, wherein the metallic electrode layer is a layer formed by spraying one or more of W, Al, Cu, Nb, Ta, Mo, Ni and an alloy containing one or more of these metal elements.

5. An electrostatic chuck member according to claim 1, characterized by having a sealed layer obtained by applying a liquid organic or inorganic silicon compound to at least one surface of the lower and upper insulating layers or mechanically polished surface and heating at 120–350° C. for 1–5 hours.

6. A method of producing an electrostatic chuck member which comprises subjecting at least one surface of a substrate to a blast treatment, spraying a metal or an alloy onto a roughened surface of the substrate to form an undercoat of a metallic layer having a thickness of 30–300 μm, forming a lower insulating layer made of $Al_2O_3$ ceramic sprayed layer having a thickness of 100–500 μm, a porosity of 1–8% and a purity of not less than 98 wt % on the undercoat, spraying a metallic spraying material having a particle size smaller than a particle size of spraying material for insulating layer on the lower insulating layer to form a metallic electrode layer having a thickness of 5–100 μm, an oxygen content of not more than 2.0 wt % and a porosity of 1–7%, forming an upper insulating layer made of $Al_2O_3$ ceramic sprayed layer having a thickness of 100–500 μm, a porosity of 1–8% and a purity of not less than 98 wt % on the metallic electrode layer, subjecting a surface of the upper insulating layer to a mechanical polishing to finish to a surface roughness Ra of about 0.1–2.0 μm, and laminating these layers in this order.

7. A method of producing an electrostatic chuck member according to claim 6, wherein the undercoat is formed by spraying one or more of Ni, Al, Cr, Co, Mo and an alloy containing one or more of these metal elements.

8. A method of producing an electrostatic chuck member according to claim 6, wherein at least one surface of each of the lower insulating layer and the upper insulating layer is sealed with an organic or inorganic silicon compound and has a volume resistivity within a range of $1 \times 10^{13}$–$1 \times 10^{15}$ Ω·cm.

9. A method of producing an electrostatic chuck member according to claim 6, wherein the metallic electrode layer is a layer formed by spraying one or more of W, Al, Cu, Nb, Ta, Mo, Ni and an alloy containing one or more of these metal elements.

10. A method of producing an electrostatic chuck member according to claim 6, wherein a sealed layer is formed by applying a liquid organic or inorganic silicon compound to a surface of upper insulating layer and/or the lower insulating layer and heating at 120–350° C. for 1–5 hours.

* * * * *